United States Patent [19]

Maschek

[11] Patent Number: 4,547,742

[45] Date of Patent: Oct. 15, 1985

[54] AMPLIFIER CIRCUIT WITH SURGE SUPPRESSION

[75] Inventor: Martin Maschek, Würenlos, Switzerland

[73] Assignee: BBC Brown, Boveri & Company, Limited, Baden, Switzerland

[21] Appl. No.: 639,063

[22] Filed: Aug. 9, 1984

[30] Foreign Application Priority Data

Aug. 18, 1983 [CH] Switzerland .................. 4510/83

[51] Int. Cl.[4] ............................................ H03F 1/14
[52] U.S. Cl. ........................................ 330/149; 330/51; 328/165
[58] Field of Search .............. 330/9, 51, 126, 149, 330/203, 295; 328/162, 165

[56] References Cited

U.S. PATENT DOCUMENTS 4,453,133 6/1984 Travis .................................. 330/149

*Primary Examiner*—James B. Mullins
*Assistant Examiner*—Steven J. Mottola
*Attorney, Agent, or Firm*—Oblon, Fisher, Spivak, McClelland & Maier

[57] ABSTRACT

An amplifier circuit including a resistor connected in series with a signal amplifier, which is designed as a feedback inverting amplifier, and an additional switching circuit serving to suppress surges. Such an amplifier circuit can, e.g., be used for amplifying the output signal of a digital-to-analog converter. The additional switching circuit operates independently of external control and without itself producing spurious signals. The switching circuit is placed in parallel to the series resistor and includes an inverting amplifier, which has faster response time than the signal amplifier, a high-pass filter and an impedance converter having a high input impedance connected in series with the input to the inverting amplifier. A voltage limiting two-terminal network is connected in series with the output of the inverting amplifier.

12 Claims, 2 Drawing Figures

AMPLIFIER CIRCUIT WITH SURGE SUPPRESSION

BACKGROUND OF THE INVENTION

1. Field of the Invention

This invention relates to an amplifier circuit in which an additional switching circuit serving to suppress surges is added to a signal amplifier.

2. Description of the Prior Art

Amplifier circuits of the above-noted type are used for amplifying signals, on which disturbing surges (glitches) are superposed. Such surges that superpose on a signal occur, for example, in switching of semiconductor switches by capacitive coupling of the control voltage in the signal path or by lack of synchronization of several parallel switching operations. They occur, for example, at the output of digital-to-analog converters or also at the input of operational amplifiers in case of reversing the feedback impedance.

It is known to make amplifier circuits, which include a dc negative feedback signal amplifier connected to a surge suppressing switching circuit, for subsequent processing of the output signal of a digital-to-analog converter, with sample and hold elements, which are connected in series with the signal amplifier and, controlled by a clock signal, blank out the signal received at the output of the digital-to-analog converter during any period in which surges can occur (S. Kirby: Deglitcher circuit refines d-a-converter output; Electronics, 4/21/1983, pp 151-152).

With these types of amplifier circuits an external control of the switching circuit serving to suppress the surges is necessary, which limits the possibilities of using the circuit and, moreover, in the context of the possible field of application causes considerable circuit complexity. Further, the fast sample and hold elements necessary for high sampling rates themselves produce disturbing surges, which, for example, in the amplification of the output signal of fast digital-to-analog converters appears as very disturbing.

SUMMARY OF THE INVENTION

Accordingly, the object of this invention is to provide a novel amplifier with surge suppression which remedies the problems associated with the conventional amplifier. The above object, and others, are achieved according to the invention, by providing a novel amplifier circuit with an additional switching circuit serving to suppress surges, which automatically suppresses disturbing surges, i.e., without outside control and without unwanted side effects.

The advantages obtained by the invention are seen especially in that, since an external control can be omitted, the circuit complexity can be substantially reduced with the usual applications in comparison with known amplifier circuits. In addition, the field of application also includes any cases where a control signal for a sampling and holding circuit could not be produced or could be produced only with economically unjustifiable circuit complexity. Further, the amplifier circuits according to the invention can be designed up to high limiting frequencies without they themselves producing spurious signals. They are suitable then, among other things, for amplifying the output signal of fast digital-to-analog converters. The compensating circuit is able to compensate the surges produced by the signal amplifier itself, if the latter is designed on the whole as an inverting amplifier with switchable inverse feedback.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
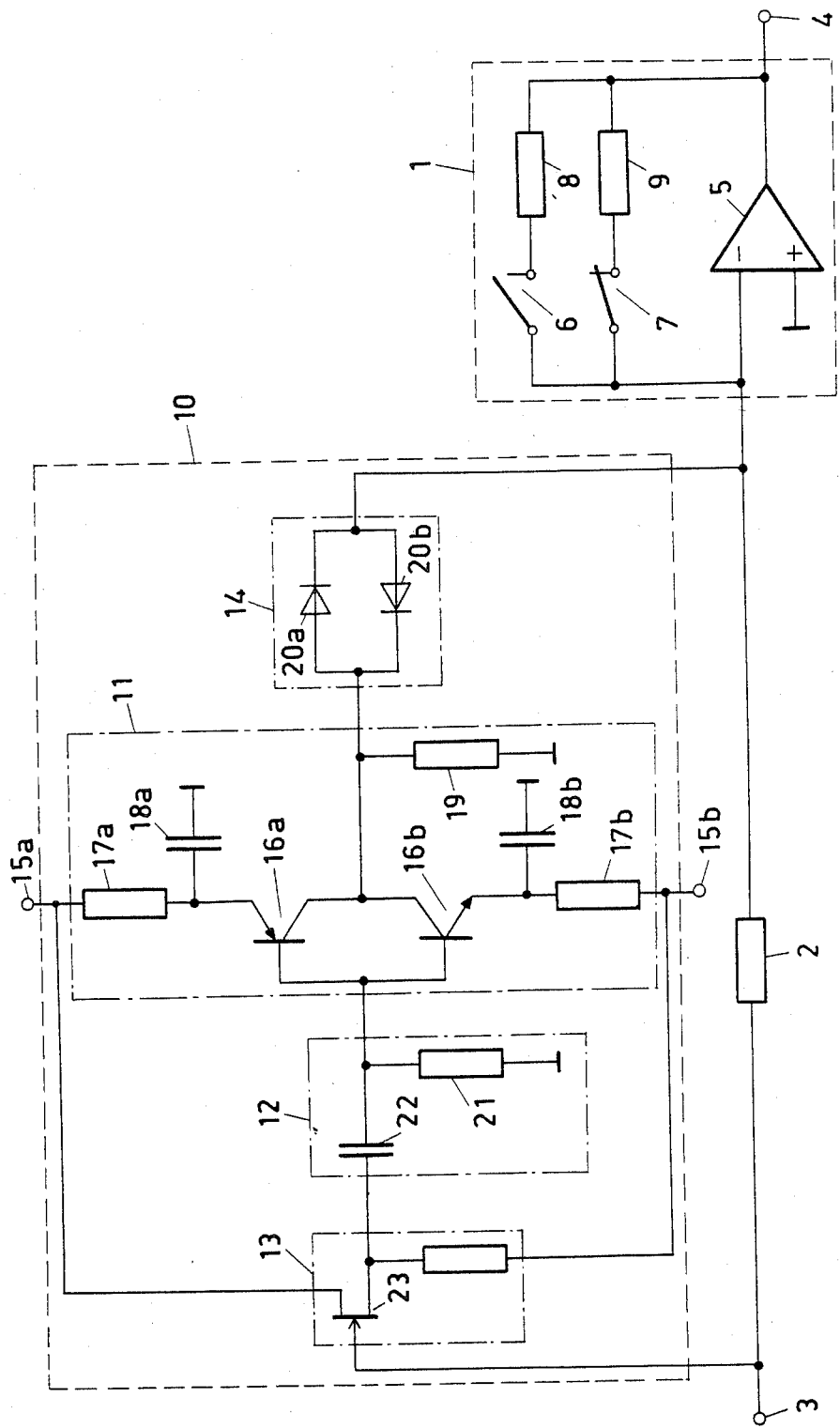
FIG. 1 is a circuit diagram of an amplifier circuit according to the invention and FIG. 2 is a waveform diagram illustrating the current and voltage patterns occurring in the amplifier circuit according to the invention.

Referring now to the drawings,

FIG. 1 shows an amplifier circuit which in its basic design exhibits a signal amplifier 1, whose input is connected to a signal input 3 by way of a dc conductive impedance, which preferably is a resistor 2, and whose output is placed on a signal output 4, and also an additional circuit 10 serving to suppress surges. The signal amplifier is designed in a known way with an inserted inverting operational amplifier 5, which in each case receives feedback by at least one of two feedback impedances 8, 9 which are connected in series with respective switches 6, 7.

The circuit serving for surge suppression is designed as compensating circuit 10, with an inverting amplifier 11, which is faster than signal amplifier 1 and whose input is connected to signal input 3 by a high-pass filter 12 and an impedance converter 13, while its output is connected to the input of signal amplifier 1 by a voltage limiting two-terminal network 14. Compensating circuit 10 is connected in parallel to resistor 2. For power supply of inverting amplifier 11 and impedance converter 13, there are provided two feed inputs 15a, 15b respectively connected to the terminals of the positive and negative poles of a dc supply (not shown). Inverting amplifier 11 is designed with two transistors, whose bases are commonly connected to its input, a pnp transistor 16a and an npn transistor 16b, whose collectors are commonly connected to the output of inverting amplifier 11 and whose emitters are each connected by resistors 17a, 17b to positive feed input 15a or to negative feed input 15b, respectively, and are shunted to ground by respective capacitors 18a, 18b, which serve to enhance the amplification of the high-frequency components. A resistor 19 is connected from the output of inverting amplifier 11 to ground. This embodiment of the inverting amplifier 11 is indeed suitable and inexpensive but, of course, other embodiments, e.g., similar to signal amplifier 1, are possible.

The voltage limiting two-terminal network 14 includes two diodes 20a, 20b which are connected antiparallel. However, other solutions are possible, depending on the voltage range. The voltage limiting network 14 should perform the function of blocking the current in both directions at least approximately until the voltage going from zero reaches a preset limiting value $U_G$ and then conduct as long as the voltage remains over the limiting value $U_G$. Threshold diode pairs are suitable for this purpose.

High-pass filter 12 is designed as a high-pass RC filter with a resistor 21 and a capacitor 22. It serves for fixing the lower limiting frequency of the working range of compensating circuit 10.

Impedance converter 13, which is to prevent capacitor 22 from being charged by a current from input 3 and reacting on signal amplifier 1, is designed with a field effect transistor 23, whose gate is placed at signal input 2, connected between feed inputs 15a, 15b.

Figure 2:
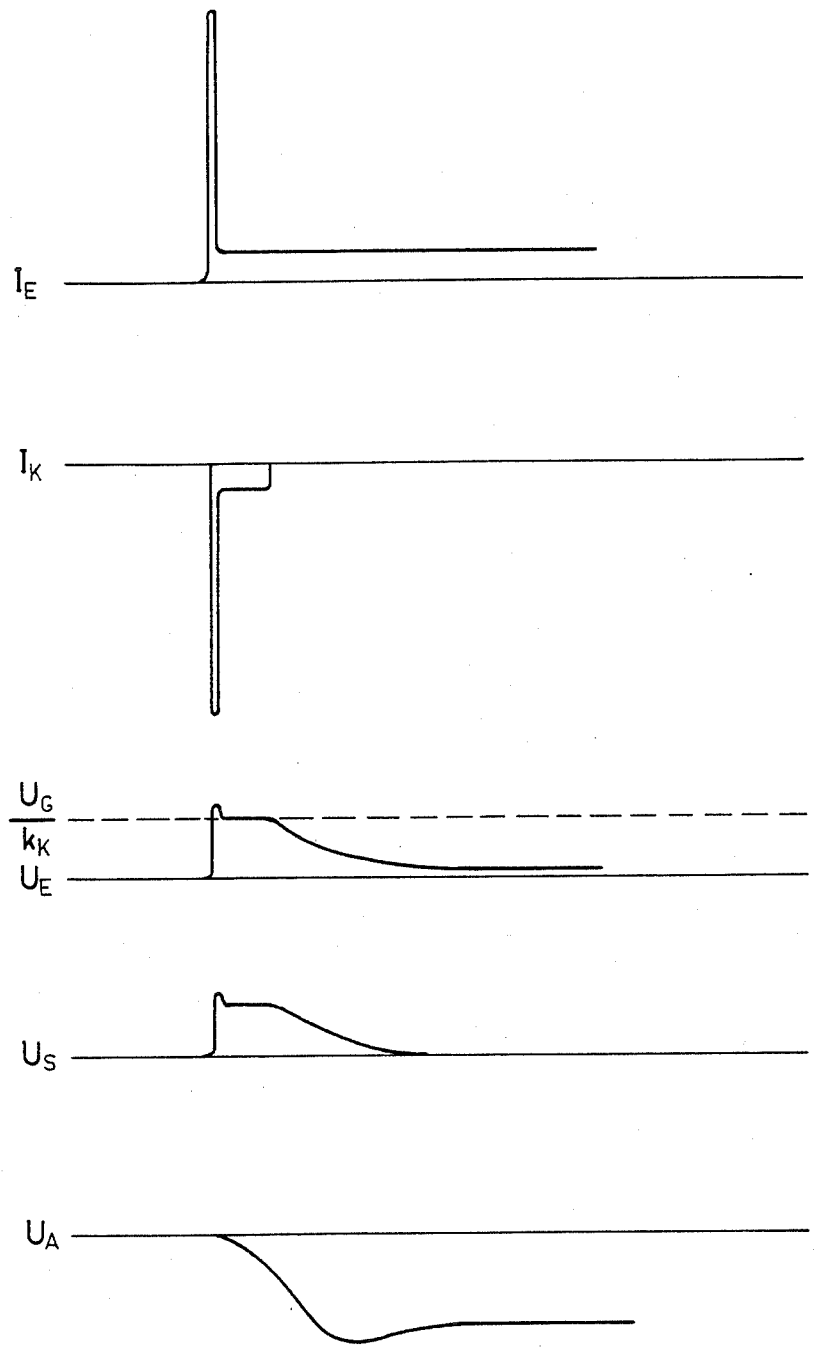

The function of the amplifier circuit according to the invention will now be illustrated more in detail with the help of FIG. 2.

Input current $I_E$, applied to signal input 3, has about the waveform, shown in FIG. 2, of a positive level superposed by a surge. It causes a fast rise of input voltage $U_E$ until the latter reaches the value $U_G/k_K$, where $k_K$ is the amplification factor of compensating circuit 10. Compensating circuit 10 then beings to deliver a compensating current $I_K$ to the summation point of signal amplifier 1, which approximately compensates input current $I_E$, so that input voltage $U_E$ quickly drops to the value $U_G/k_K$ and maintains this value until it is decreased below this value by signal amplifier 1, whose output voltage $U_A$ drops comparatively slowly and by feedback acts on the voltage at the summation point $U_S$ and further on input voltage $U_E$, whereupon compensating current $I_K$ ceases. Because of the considerable compensation of the surge by compensating circuit 10, the pattern of output voltage $U_A$ of signal amplifier 1, which is applied to signal output 4, corresponds to a considerable degree to the pattern with an undisturbed input signal.

Resistor 2 is not necessary to achieve the compensating effect. However, it can be used to optimize the effect of the compensating circuit in regard to specific conditions of use, e.g., the expected form and height of the surges. In this case it can be so adjusted that, because of the voltage drop occurring access it, the temporary pattern of the voltage at the summation point $U_S$ develops especially favorably and subsequently the deviation of the pattern of output voltage $U_A$ from the undisturbed pattern is minimal.

Output voltage $U_A$ in FIG. 2 is represented on a substantially smaller scale than the other two voltages. Normally it is on an order of magnitude of some volts, voltages $U_E$, $U_S$ of some millivolts.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An amplifier circuit comprising:
a signal input and a signal output;
a signal amplifier including an inverting dc negative feedback amplifier, and means connected to said signal input for applying an input signal to said feedback amplifier, said feedback amplifier having an output connected to said signal output; and
compensating circuit means connected to said input signal applying means for suppressing surges existing on said signal input, comprising,
an inverting amplifier connected to said signal input and characterized by a limiting frequency greater than that of said feedback amplifier, and
a voltage limiting two-terminal network connected in series with said inverting amplifier and defining a transfer characteristic such that for voltages below a predetermined threshold said network is substantially non-conductive in both directions and for voltages above said threshold, said network is conducting and the output of said inverting amplifier is connected to said means applying an input to said feedback amplifier.

2. An amplifier circuit according to claim 1, wherein said compensating means comprises:
a high-pass filter connected in series with said inverting amplifier.

3. An amplifier circuit according to claim 2, wherein said high-pass filter comprises:
a high-pass RC filter.

4. An amplifier circuit according to claim 3, wherein said compensating means comprises:
an impedance converter having a high input impedance connected in series with said high-pass filter and connected to said signal input.

5. An amplifier circuit according to claim 4, wherein said impedance converter comprises:
an input field-effect transistor having a gate connected to said signal input.

6. An amplifier circuit according to claim 1, wherein said means for applying an input signal to said feedback amplifier comprises:
a dc conductive impedance inserted between said signal input and an input of said feedback amplifier, wherein said compensating means is connected in parallel to said conductive impedance.

7. An amplifier circuit according to claim 2, wherein said means for applying an input signal to said feedback amplifier comprises:
a conductive dc impedance inserted between said signal input and an input of said feedback amplifier, wherein said compensating means is connected in parallel to said conductive impedance.

8. An amplifier circuit according to claim 3, wherein said means for applying an input signal to said feedback amplifier comprises:
a conductive dc impedance inserted between said signal input and an input of said feedback amplifier, wherein said compensating means is connected in parallel to said conductive impedance.

9. An amplifier circuit according to claim 4, wherein said means for applying an input signal to said feedback amplifier comprises:
a conductive dc impedance inserted between said signal input and an input of said feedback amplifier, wherein said compensating means is connected in parallel to said conductive impedance.

10. An amplifier circuit according to claim 5, wherein said means for applying an input signal to said feedback amplifier comprises:
a conductive dc impedance inserted between said signal input and an input of said feedback amplifier, wherein said compensating means is connected in parallel to said conductive impedance.

11. An amplifier circuit according to claim 1, wherein said inverting amplifier comprises:
a pnp transistor having a base, collector and emitter;
an npn transistor having a base, collector and emitter, wherein the bases of said pnp and npn transistors are interconnected and serve as an input to said inverting amplifier and the collectors of said pnp and npn are interconnected and serve as output of said inverting amplifier; and
a resistor connected in parallel with the output of said inverting amplifier.

12. An amplifier circuit according to claim 11, wherein said inverting amplifier comprises first and second capacitors respectively connecting the emitters of said pnp and npn transistors to a ground potential.

* * * * *